United States Patent
Lue et al.

(10) Patent No.: US 8,325,530 B2
(45) Date of Patent: Dec. 4, 2012

(54) CELL OPERATION METHODS USING GATE-INJECTION FOR FLOATING GATE NAND FLASH MEMORY

(75) Inventors: Hang-Ting Lue, Hsinchu (TW);
Tzu-Hsuan Hsu, Chiayi County (TW);
Erh-Kun Lai, Taichung (TW)

(73) Assignee: MACRONIX International Co., Ltd., Hsinchu (TW)

( * ) Notice: Subject to any disclaimer, the term of this patent is extended or adjusted under 35 U.S.C. 154(b) by 1432 days.

(21) Appl. No.: 11/542,749

(22) Filed: Oct. 3, 2006

(65) Prior Publication Data
US 2008/0080248 A1 Apr. 3, 2008

(51) Int. Cl.
*G11C 11/34* (2006.01)
(52) U.S. Cl. .......... 365/185.18; 365/185.24; 365/185.27
(58) Field of Classification Search ............ 365/185.18, 365/185.24, 185.27
See application file for complete search history.

(56) References Cited

U.S. PATENT DOCUMENTS

| | | | |
|---|---|---|---|
| 5,780,341 A * | 7/1998 | Ogura | 438/259 |
| 5,889,303 A * | 3/1999 | Eckert et al. | 257/316 |
| 6,040,216 A * | 3/2000 | Sung | 438/257 |
| 6,180,461 B1 * | 1/2001 | Ogura | 438/266 |
| 6,331,464 B1 * | 12/2001 | Liou et al. | 438/257 |
| 6,556,481 B1 * | 4/2003 | Hsu et al. | 365/185.24 |
| 6,635,533 B1 * | 10/2003 | Chang et al. | 438/259 |
| 6,657,893 B2 * | 12/2003 | Takahashi et al. | 365/185.15 |
| 6,838,343 B2 * | 1/2005 | Hung et al. | 438/257 |
| 6,893,918 B1 * | 5/2005 | Wang et al. | 438/257 |
| 6,921,696 B2 * | 7/2005 | Rudeck | 438/259 |
| 6,984,559 B2 * | 1/2006 | Wang et al. | 438/257 |
| 7,005,699 B2 * | 2/2006 | Chen et al. | 257/315 |
| 7,045,852 B2 * | 5/2006 | Van Duuren et al. | 257/316 |
| 2002/0089014 A1 | 7/2002 | Chern | |
| 2003/0032241 A1 * | 2/2003 | Seo et al. | 438/257 |
| 2005/0157549 A1 | 7/2005 | Mokhlesi et al. | |
| 2005/0227435 A1 | 10/2005 | Oh et al. | |
| 2007/0004148 A1 * | 1/2007 | Yang | 438/264 |
| 2008/0099827 A1 * | 5/2008 | Kreupl | 257/324 |

FOREIGN PATENT DOCUMENTS

| | | |
|---|---|---|
| EP | 0762429 | 3/1997 |
| JP | 2003124360 | 4/2003 |
| JP | 2008047729 | 2/2008 |
| TW | 503513 | 9/2002 |

(Continued)

OTHER PUBLICATIONS

Kim, Kinam, "Technology for sub-50nm DRAM and NAND Flash Manufacturing", Advanced Technology Development, Aug. 2005, Korea, 4 pages.

(Continued)

*Primary Examiner* — Alexander Sofocleous
*Assistant Examiner* — Hien Nguyen
(74) *Attorney, Agent, or Firm* — Jianq Chyun IP Office

(57) ABSTRACT

A method of performing an operation on a flash memory cell device, used when a gate coupling ratio between a floating gate and a control gate of less than 0.4. A potential is required to be applied across the control gate. Electrons are either injected to the floating gate from the control gate or ejected from the floating gate to the control gate. The operation associated with the injection or the ejection is determined by the nature of a silicon channel provided in the device. Devices using a bulk-tied FinFET-like structure are particularly suited to this method. The method is also particularly suited for use on cells in a NAND array.

9 Claims, 7 Drawing Sheets

Process Parameters:
FW: Fin Width
FH: Fin Height
O1: Bottom Oxide Thickness

PL1: PL1 Thickness
O2: Tunneling Oxide
FH': Recess Thickness for HDP Oxide
F: Technology Node

FOREIGN PATENT DOCUMENTS

WO    2005073979    8/2005

OTHER PUBLICATIONS

Cho, Eun Suk, et al., "Technology Breakthrough of Body-Tied Fin FET for sub 50 nm NOR Flash Memory", 2006 Symposium on VLSI Technology Digest of Technical Papers, Aug. 2006, Korea, 2 pages.

Lee, Jae-Duk, et al., "Effects of Floating-Gate Interference on NAND Flash Memory Cell Operation", IEEE Electron Device Letters, May 2002, pp. 264-266, vol. 23, No. 5, Korea.

"Office Action of Taiwan counterpart application", issued on Jun. 4, 2009, p. 1-p. 4.

"Office Action of Europe counterpart application", issued on Aug. 18, 2009, p. 1-p. 2.

"Office Action of Japan Counterpart Application", issued on Aug. 7, 2012, p1-p3, in which the listed references were cited.

* cited by examiner

Lg: Channel Length ~F
F: Technology Node

Process Parameters:
FW: Fin Width
FH: Fin Height
O1: Bottom Oxide Thickness
PL1: PL1 Thickness
O2: Tunneling Oxide
FH': Recess Thickness for HDP Oxide
F: Technology Node

|  | F=50nm | F=40nm | F=30nm | F=20nm |
|---|---|---|---|---|
| Channel Length (Lg) | 500 Å | 400 Å | 300 Å | 200 Å |
| Fin Width (FW) | 200 Å | 160 Å | 120 Å | 80 Å |
| Fin Height (FH) | 800 Å | 640 Å | 480 Å | 360 Å |
| HDP Recess (FH') | 300 Å | 240 Å | 180 Å | 250 Å |
| Bottom Oxide (O1) | 70 Å | 70 Å | 60 Å | 60 Å |
| PL1 Thickness (PL1) | 150 Å | 120 Å | 90 Å | 50 Å |
| Poly Oxide (O2) | 100 Å | 100 Å | 90 Å | 90 Å |
| $\alpha_G$ | 0.3 | 0.29 | 0.29 | 0.35 |
| $\alpha_B$ | 0.62 | 0.61 | 0.59 | 0.52 |
| $\alpha_{WL-WL}$ | 0.026 | 0.031 | 0.035 | 0.04 |
| $\alpha_{BL-BL}$ | 0.048 | 0.066 | 0.082 | 0.088 |
| PL1 Distance in BL Direction | 360 Å | 260 Å | 180 Å | 100 Å |

CELL OPERATION METHODS USING GATE-INJECTION FOR FLOATING GATE NAND FLASH MEMORY

BACKGROUND OF THE INVENTION

The use of floating gate technology in flash memory devices is well known. Typically, a Si channel of n or p type semiconductor is provided. The floating gate transistor is surrounded by oxide, enabling a charge stored on the gate to remain there. Program and erase operations take place by a process of channel injection. Electrons undergo Fowler-Nordheim (FN) tunneling and are transferred from the channel to the floating gate, and vice-versa, during operation.

To provide an efficient channel injection, the possibility of a gate injection (transfer of electrons between the control gate and floating gate via FN tunneling) must be reduced. This is accomplished by maximizing the gate coupling ratio. The gate coupling ratio (GCR) is defined as the ratio of floating gate potential to control gate potential. A GCR of 1 is optimal, but a GCR greater than 0.6 is sufficient for most flash memory devices.

This result is satisfactory for larger memory devices, but when these devices are scaled down, a high GCR becomes difficult to maintain. For NAND flash in particular, a GCR of less than 0.3 is predicted when the node is below 45 nm. The bottom tunnel oxide will not have a sufficiently large electric field to allow FN tunneling. Moreover, future flash memory devices will require FinFET-like structures to improve device short-channel characteristics. These structures have a naturally large channel to floating gate coupling capacitance, and thus a naturally low GCR.

Additionally, there is a problem of inter-floating gate coupling in traditional flash memory device arrays. Inter-floating gate coupling capacitance is comparable to the gate coupling capacitance of the channel and floating gate as the density of cells in the array becomes greater. This causes interference among the cells which deteriorates functionality of the flash memory device. Furthermore, electric field stress on the gate oxide affects reliability and endurance of the unit.

It is therefore desirable to operate the floating gate apparatus in such a way as to enable efficient FN tunneling to the floating gate, particularly when using a FinFET-like structure. It is also desirable to operate the floating gate apparatus in such a way as to increase reliability and endurance, and to reduce inter-cell interference as the devices are scaled down.

BRIEF SUMMARY OF THE INVENTION

A method of performing an operation on a flash memory cell device is provided when a gate coupling ratio between a floating gate and a control gate is less than 0.4. A potential is required to be applied across the control gate. Electrons are either injected to the floating gate from the control gate or ejected from the floating gate to the control gate. The operation associated with the injection or the ejection is determined by the nature of a silicon channel provided in the device.

For n-Channel cells, writing is accomplished by ejecting electrons from the floating gate to the control gate. Erasing is accomplished by injecting electrons to the floating gate from the control gate. For p-Channel cells, writing is accomplished by injecting electrons to the floating gate from the control gate. Erasing is accomplished by ejecting electrons from the floating gate to the control gate.

Devices having a bulk-tied FinFET-like structure are particularly suited to this method, as the structure creates a naturally low gate coupling ratio. This method is also particularly suited for use on cells in a NAND flash memory array since it allows scalability of the cells down to below 20 nm.

BRIEF DESCRIPTION OF THE DRAWINGS

The foregoing summary, as well as the following detailed description of preferred embodiments of the invention, will be better understood when read in conjunction with the appended drawings. For the purpose of illustrating the invention, there is shown in the drawings embodiments which are presently preferred. It should be understood, however, that the invention is not limited to the precise arrangements and instrumentalities shown.

DETAILED DESCRIPTION OF THE INVENTION

Figure 1:
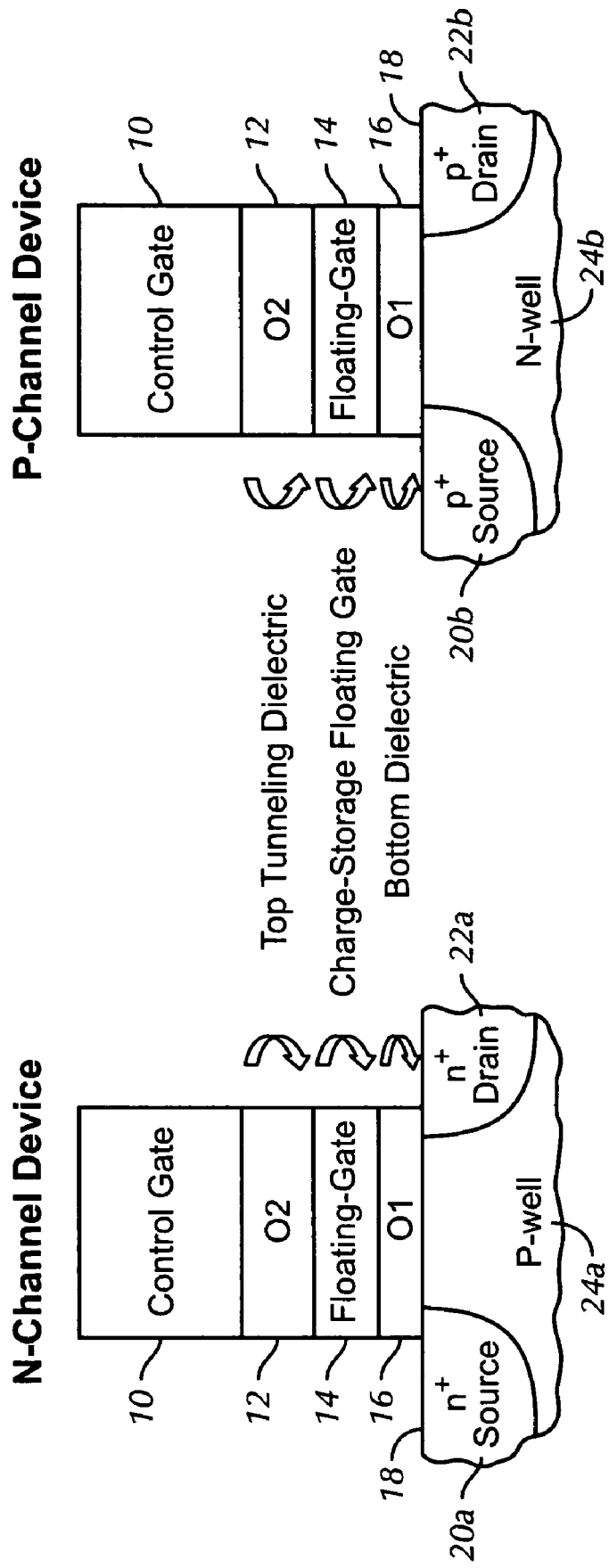
FIG. 1 shows typical cross-sectional views in the channel length direction of flash memory cells for use in one preferred embodiment of the present invention.

FIG. 1 shows typical cross-sectional views in the channel length direction of flash memory cells for use in embodiments of the present invention. The left diagram of FIG. 1 shows an n-Channel device. The structure contains a Si channel 18, with a p-well 24a and n-doped source 20a and drain 22a. In preferred embodiments, a bulk-tied FinFET structure is used. The structure also contains a gate oxide 16, a charge-storage floating gate 14, an inter-poly, top-tunneling dielectric 12, and a control gate 10. The right side of FIG. 1 shows a p-Channel device, which is identical to the n-Channel device, except that the Si channel 18 contains an n-well 24b, and p-doped source 20b and drain 22b.

The bottom gate oxide 16 is under relatively small electric field stress, typically less than about 7 MV/cm, during program and erase operations. This avoids any FN tunneling, which prevents much of the damage occurring in conventional flash memory devices, and allows a better DC performance. Additionally, the bottom oxide 16 and the tunneling oxide 12 are separate. This enhances reliability and endurance.

Figure 2A:
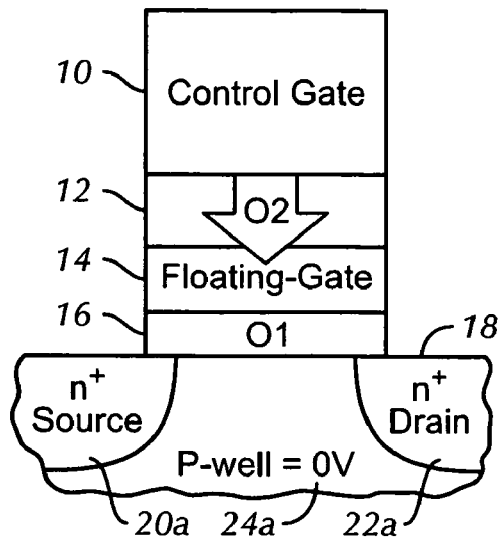
FIGS. 2A, 2B, 3A, and 3B show electron injection and electron ejection by ±FN tunneling in both n and p Channel cells in accordance with one preferred embodiment of the present invention.
Figure 2B:
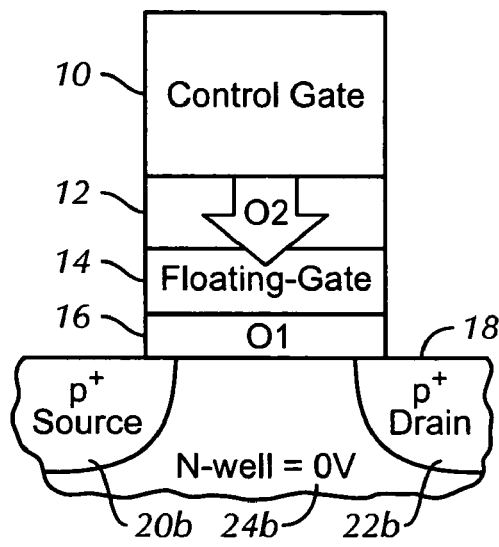

Referring to FIGS. 2A and 2B, the electron injection from the control gate 10 by −FN tunneling is illustrated. Referring to FIG. 2A, an erase is affected on the n-Channel device by applying a high threshold voltage to the control gate 10, for example, −16V. For a GCR of 0.3, the potential of the floating gate 14 is −4.8 V. The electric field in the bottom oxide 16 is less than 8 MV/cm, but the electric field in the top oxide 12 is greater than 10 MV/cm, and therefore tunneling occurs from control gate 10 to the floating gate 14. FIG. 2B, showing a p-Channel device, is similar. However the device is performing a write operation rather than an erase, due to the nature of the Si channel 18. A GCR of less than about 0.4 is preferred for electron injection in both n-Channel and p-Channel devices.

Figure 3A:
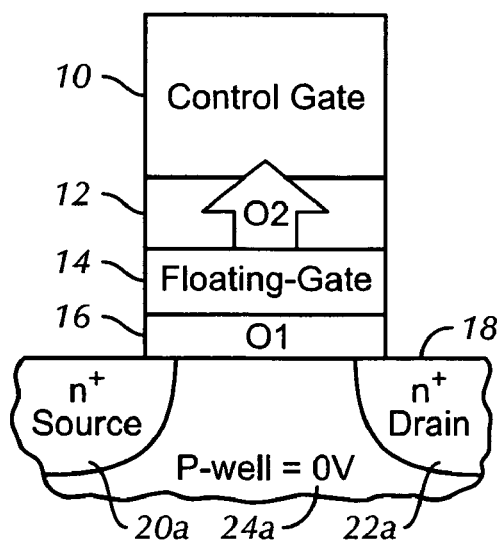
Figure 3B:
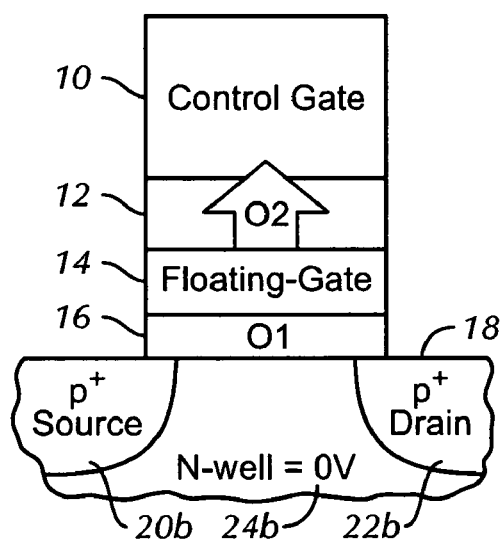

Referring to FIGS. 3A and 3B, the electron ejection from the floating gate 14 by +FN tunneling is illustrated. Referring to FIG. 3A, a write operation is affected on the n-Channel device by applying a low threshold voltage to the control gate 10, for example, +16V. For a GCR of 0.3, the potential of the floating gate 14 will be +4.8 V. The electric field in the bottom oxide 16 is less than 8 MV/cm, but the electric field in the top oxide 12 is greater than 10 MV/cm, and therefore tunneling occurs from the floating gate 14 to the control gate 10. FIG. 3B, showing a p-Channel device, is similar. However the device is performing an erase operation rather than a write operation, due to the nature of the Si channel 18. A GCR of less than about 0.4 is preferred for electron ejection in both n-Channel and p-Channel devices.

Figure 4:
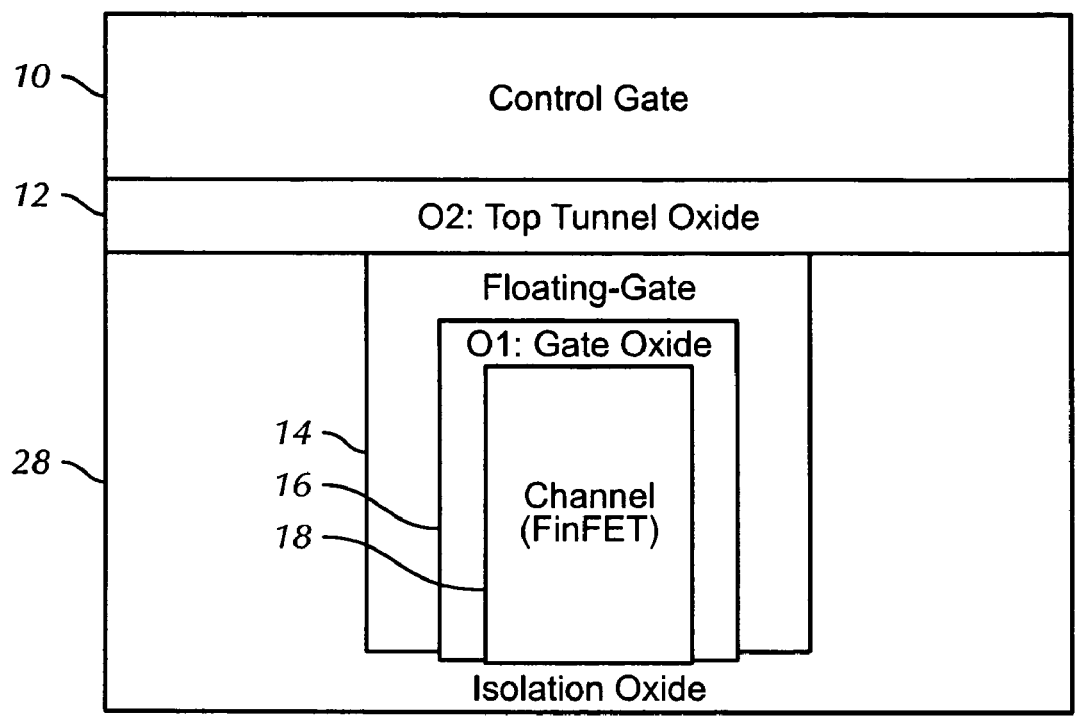
FIG. 4 shows a cross-sectional view in the channel-width direction of a preferred flash memory cell for use in one preferred embodiment of the present invention.

FIG. 4 shows a cross-sectional view in the channel-width direction of a flash memory cell for use in one preferred embodiment of the present invention. A high density plasma (HDP) oxide 28 surrounds the channel 18, gate oxide 16, and floating gate 14. This oxide 28 isolates the cell from surrounding cells. The Si channel 18 is a FinFET structure. One method of obtaining a small GCR is to increase the area between the channel 18 and the floating gate 14, thereby increasing the coupling capacitance between the two. A typical FinFET structure naturally creates a large coupling area between the channel 18 and the floating gate 14, which makes it particularly suitable for use in accordance with a preferred embodiment of the present invention.

Figure 5:
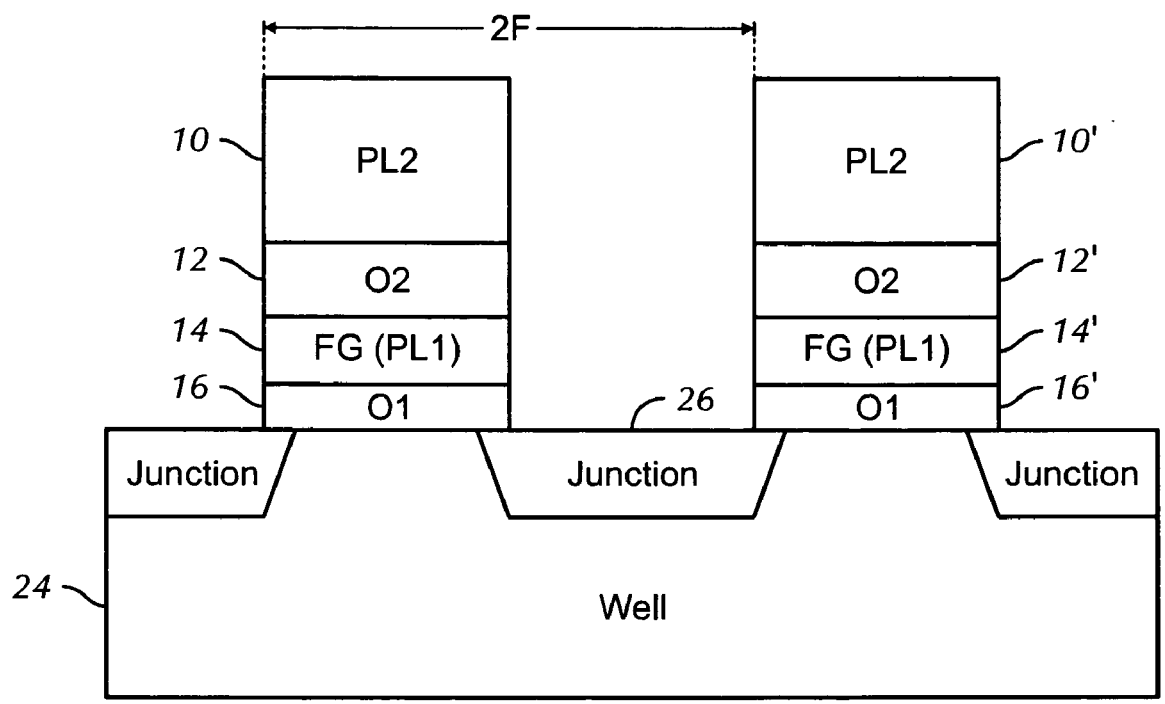
FIGS. 5-6 show a cross-sectional view in the channel-length and width directions of two flash memory cells in NAND arrays for use in accordance with one preferred embodiment of the present invention.

FIG. 5 shows a cross-sectional view in the channel-length direction of two flash memory cells in a NAND array for use in accordance with a preferred embodiment of the present invention. A well 24 runs along a bit line (not shown in FIG. 5) in the array. The cells share a junction 26. The distance between the first corner of the control gate 10 and the corresponding corner of control gate 10' is 2F, where F is the width of the cell, also called a technology node.

Figure 6:
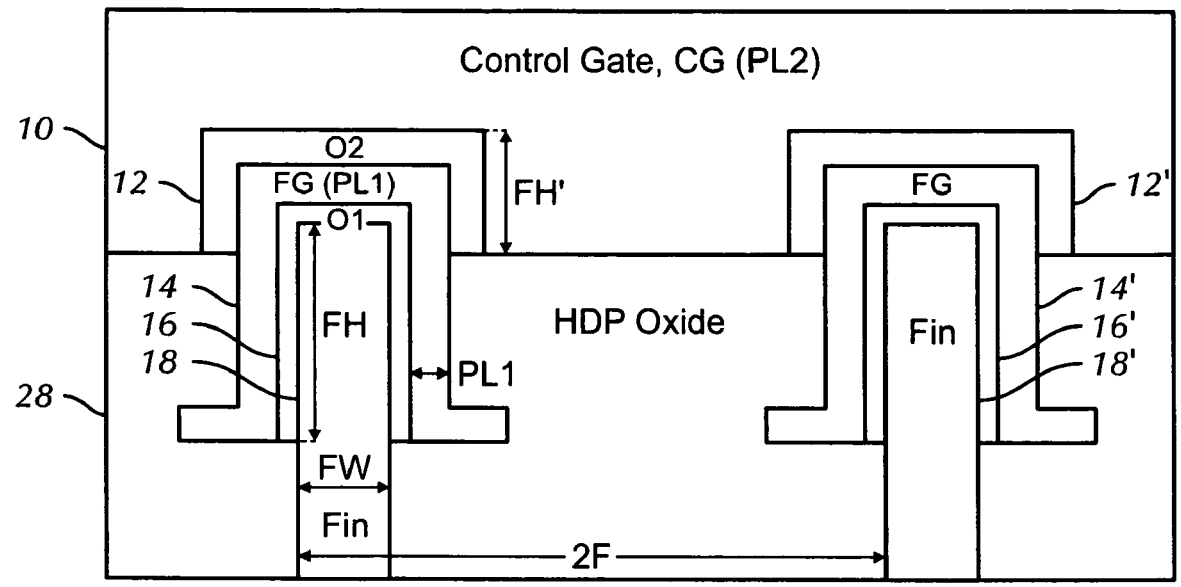

FIG. 6 shows a cross-sectional view in the channel-width direction of two flash memory cells in a NAND array for use in accordance with a preferred embodiment of the present invention. The HDP oxide 28 isolates the channel fins 18 and 18' from each other. The control gate 10 runs along a word line (not shown in FIG. 6) in the array. The cells share this gate 10. The distance between the first edge of the fin 18 and the corresponding edge of fin 18' is 2F, where F is as defined for FIG. 5.

Figure 7A:
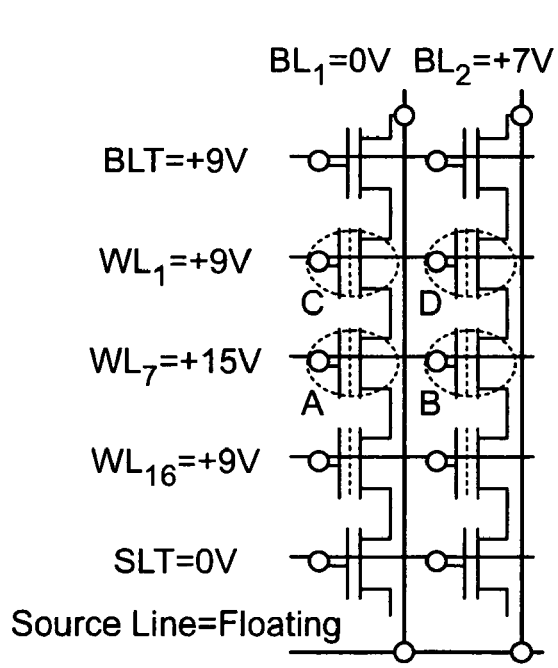
FIGS. 7A-7C and 8A-8C show operations on cells in n-Channel and p-Channel NAND arrays for use in accordance with one preferred embodiment of the present invention.
Figure 7B:
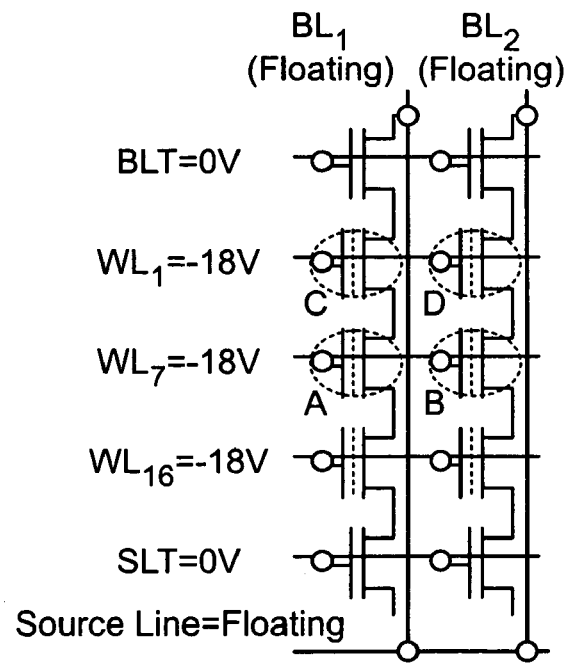
Figure 7C:
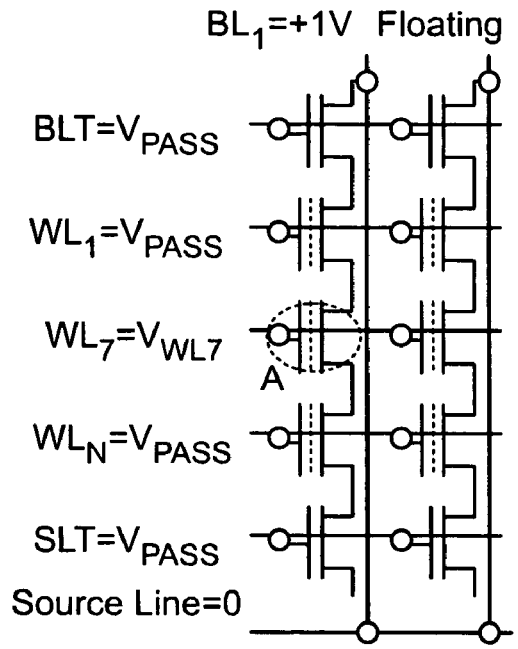

FIGS. 7A, 7B, and 7C show operations in an n-Channel NAND array in accordance with a preferred embodiment of the present invention. In FIG. 7A, the threshold voltage for cell A is lowered by applying, for example, 15 V along the adjoining word line and grounding the corresponding bit line. +FN tunneling occurs and cell A is programmed. Neighboring cells B, C, and D have program disturbances at acceptable levels. In FIG. 7B, the threshold voltage is increased to, for example, −18 V on all word lines. −FN tunneling occurs and programmed cells are erased. In FIG. 7C, cell A is read out by applying an appropriate potential to the corresponding word line, and applying a pass voltage to other word lines to allow a read through current.

Figure 8A:
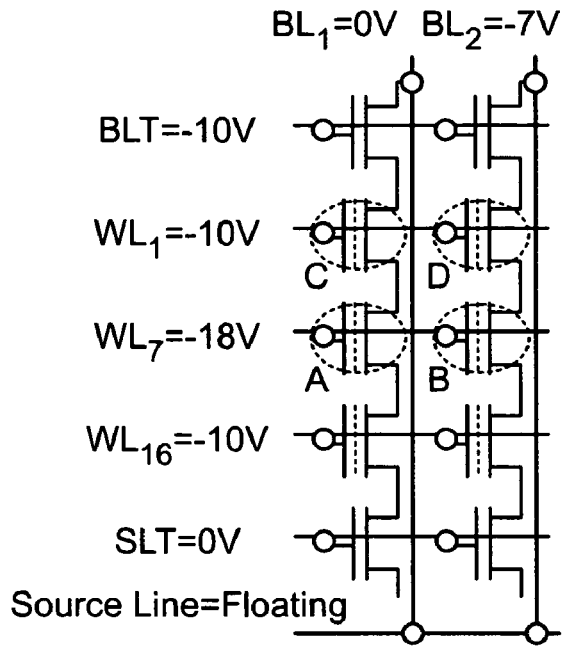
Figure 8B:
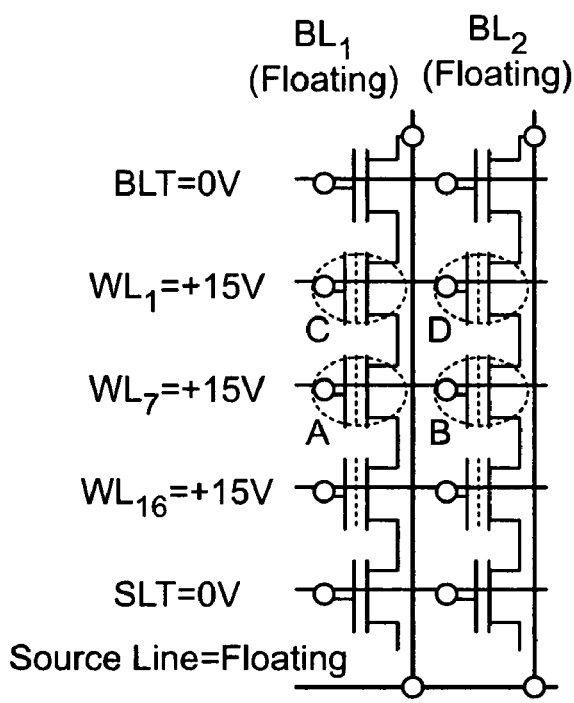
Figure 8C:
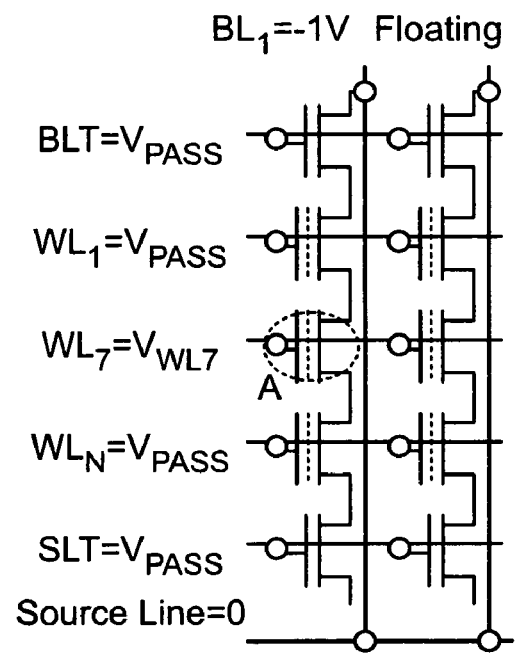

FIGS. 8A, 8B, and 8C show operations in a p-Channel NAND array in accordance with a preferred embodiment of the present invention. In FIG. 8A, the threshold voltage for cell A is increased by applying, for example, −18 V along the adjoining word line and grounding the corresponding bit line. −FN tunneling occurs and cell A is programmed. Neighboring cells B, C, and D have program disturbances at acceptable levels. In FIG. 8B, the threshold voltage is lowered to, for example, +15 V on all word lines. +FN tunneling occurs and programmed cells are erased. In FIG. 8C, cell A is read out by applying an appropriate potential to the corresponding word line, and applying a pass voltage to other word lines to allow a read through current.

Figure 9A:
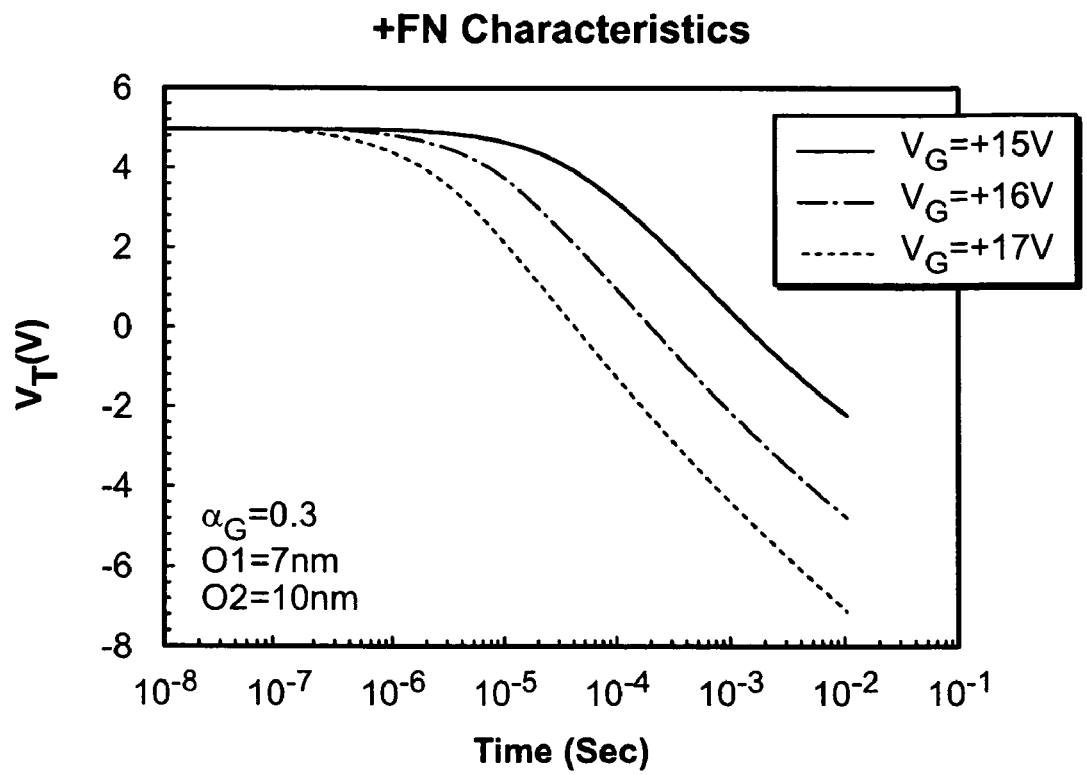
FIGS. 9A and 9B show plots of threshold voltage (in volts) vs. time (in seconds, logarithmic scale).
Figure 9B:
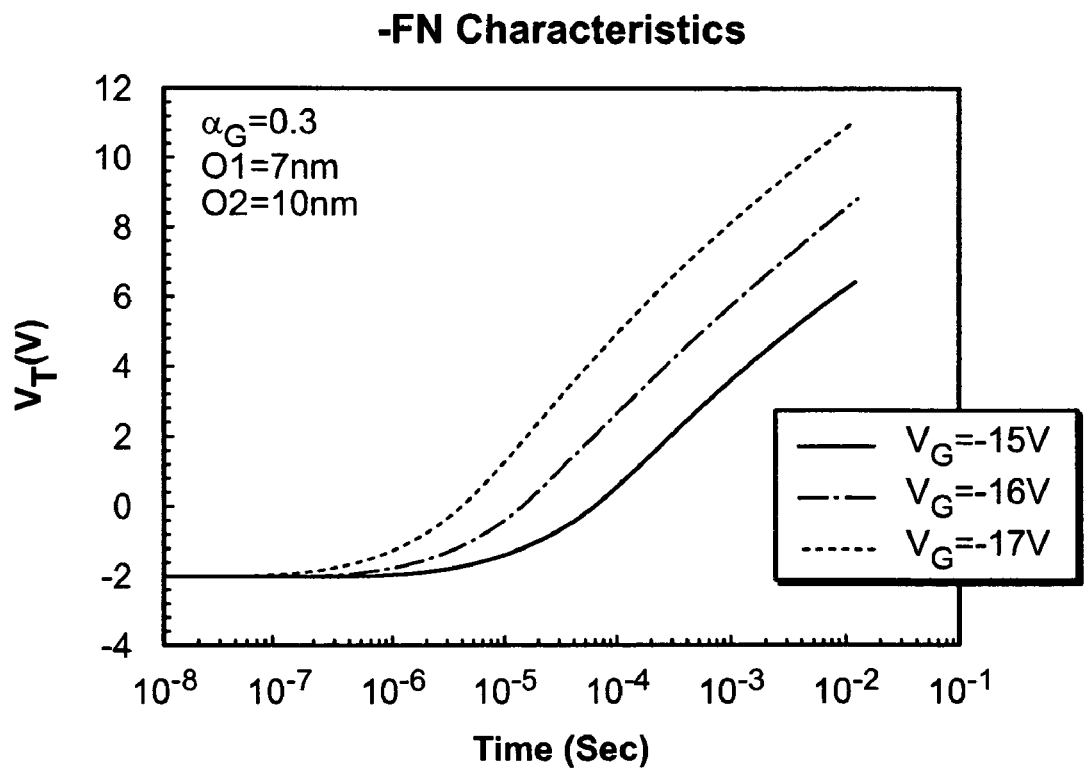

FIGS. 9A and 9B are plots of threshold voltage (in volts) vs. time (in seconds, logarithmic scale). The plot in FIG. 9A shows the drop in threshold voltage associated with +FN tunneling from the floating gate. The GCR is fixed at 0.3, the bottom oxide thickness (O1) is set to 7 nm, and the tunneling oxide thickness (O2) is set to 10 nm. Three different potentials were applied to the control gate. The results demonstrate that a large memory window can be obtained using a medium range voltage. The plot in FIG. 9B shows the increase in threshold voltage associated with −FN tunneling from the control gate. The simulation sets the same GCR, O1, and O2 parameters as in FIG. 9A, and applies the same potentials across the control gate.

Figure 10:
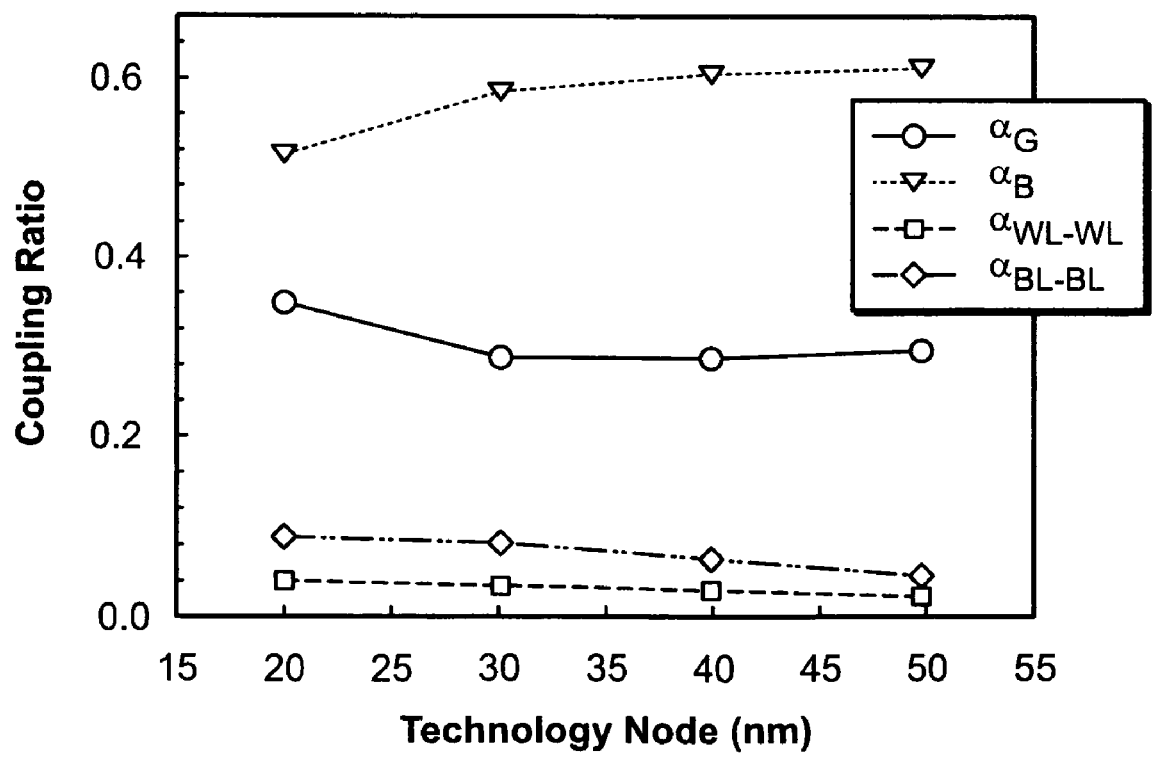
FIG. 10 shows data for technology nodes of varying sizes indicating scalability down to less than 20 nm.

FIG. 10 shows a table and plot of coupling ratio vs. technology node size (in nm). The simulation was conducted with decreasing node size down to about 20 nm. $\alpha_G$ is the GCR. $\alpha_B$ is the coupling ratio between the floating gate and the channel. $\alpha_{WL\text{-}WL}$ is the interference coupling ratio between cells on the same word line. $\alpha_{BL\text{-}BL}$ is the interference coupling ratio between cells on the same bit line. The remaining process parameters in the left-hand column of the table are defined and labeled in FIGS. 5 and 6.

The data from FIG. 10 shows that a floating gate device utilizing gate-injection methods as described above has scalability down to a technology node size of less than about 20 nm. The gate coupling ratio can be maintained at about 0.3. Additionally, the interference coupling ratios from adjacent cells can be limited to below 0.1, eliminating much of the deterioration on cell function.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention.

What is claimed is:

1. A method of performing an operation on a flash memory cell device, the device having a gate coupling ratio between a floating gate and a control gate of less than 0.4, the method comprising:
   (a) providing a potential across the control gate; and
   (b) injecting electrons to the floating gate from the control gate or ejecting electrons from the floating gate to the control gate.

2. A method of performing an operation on a flash memory cell device, the device having a gate coupling ratio between a floating gate and a control gate of less than 0.4, the method comprising:
   (a) providing a potential across the control gate; and
   (b) injecting electrons to the floating gate from the control gate or ejecting electrons from the floating gate to the control gate, wherein the flash memory cell device has a bulk-tied FinFET-like structured silicon channel.

3. The method of claim 2, wherein the silicon channel is an n-channel type, and step (b) further comprises:
   (i) programming the cell by ejecting electrons from the floating gate to the control gate; and (ii) erasing the cell by injecting electrons to the floating gate from the control gate.

4. The method of claim 2, wherein the silicon channel is a p-channel type, and step (b) further comprises:
   (i) programming the cell by injecting electrons to the floating gate from the control gate; and
   (ii) erasing the cell by ejecting electrons from the floating gate to the control gate.

5. A method of performing an operation on a flash memory cell device, the device having a gate coupling ratio between a floating gate and a control gate of less than 0.4, the method comprising:
   (a) providing a potential across the control gate; and
   (b) injecting electrons to the floating gate from the control gate or ejecting electrons from the floating gate to the control gate, wherein the flash memory cell device is provided in a NAND flash memory array and has a bulk-tied FinFET-like structured silicon channel.

6. The method of claim 5, wherein the silicon channel is an n-channel type, and step (b) further comprises:
   (i) programming the cell by ejecting electrons from the floating gate to the control gate; and
   (ii) erasing the cell by injecting electrons to the floating gate from the control gate.

7. The method of claim 5, wherein the silicon channel is a p-channel type, and step (b) further comprises:
   (i) programming the cell by injecting electrons to the floating gate from the control gate; and
   (ii) erasing the cell by ejecting electrons from the floating gate to the non-split control gate.

8. A method of performing an operation on a flash memory cell device, the device having a gate coupling ratio between a floating gate and a non-split control gate of less than 0.4, the method comprising:
   (a) providing a potential across the non-split control gate; and
   (b) injecting electrons to the floating gate from the non-split control gate or ejecting electrons from the floating gate to the non-split control gate.

9. The method of claim 1, wherein the device is a non-split gate memory cell.

* * * * *